United States Patent [19]
Hori

[11] Patent Number: 5,302,913
[45] Date of Patent: Apr. 12, 1994

[54] POWER AMPLIFYING CIRCUIT CAPABLE OF PRODUCING AN OUTPUT SIGNAL HAVING A DESIRED WAVEFORM

[75] Inventor: Tsuguo Hori, Tokyo, Japan
[73] Assignee: NEC Corporation, Tokyo, Japan
[21] Appl. No.: 952,807
[22] Filed: Sep. 28, 1992
[30] Foreign Application Priority Data Sep. 27, 1991 [JP] Japan .................................. 3-249740

[51] Int. Cl.⁵ .............................................. H03G 3/20
[52] U.S. Cl. .................................. 330/129; 330/138; 330/279; 455/126
[58] Field of Search ................. 330/129, 138, 279; 455/116, 126, 127; 375/68, 70, 71, 98

[56] References Cited
U.S. PATENT DOCUMENTS

| | | | |
|---|---|---|---|
| 4,706,262 | 11/1987 | Ohta ........................... | 375/60 |
| 5,095,542 | 3/1992 | Suematsu et al. ............ | 455/127 |
| 5,159,283 | 10/1992 | Jensen ......................... | 330/129 |
| 5,193,223 | 3/1993 | Walczak et al. ............. | 455/116 X |

FOREIGN PATENT DOCUMENTS 0369135 5/1990 European Pat. Off. .

*Primary Examiner*—James B. Mullins
*Attorney, Agent, or Firm*—Sughrue, Mion, Zinn, Macpeak & Seas

[57] ABSTRACT

For use in amplifying an input signal having an input electric power in response to an amplification control signal to produce an output signal having an amplified electric power and a desired waveform, a power amplifying circuit comprises a reference signal generator (22) for generating a reference signal with a predetermined waveform which defines the desired waveform. A multiplier (23) multiplies the reference signal and a power control signal produced by a power control signal generator (21) to produce a level control signal. A comparator (17) compares the level control signal and a detection signal produced by a detector (14) to produce an error signal. A driver (18) drives a power amplifier (11) based on the error signal.

2 Claims, 4 Drawing Sheets

POWER AMPLIFYING CIRCUIT CAPABLE OF PRODUCING AN OUTPUT SIGNAL HAVING A DESIRED WAVEFORM

BACKGROUND OF THE INVENTION

This invention relates to a power amplifying circuit, such as a final stage amplifier of a radio transmitter, for amplifying an input signal having an electric power in response to an amplification control signal to produce an output signal having an amplified electric power.

The power amplifying circuit is particularly useful in a base station of a mobile radio communication network.

In the mobile radio communication network, a mobile station usually moves in a service area of the base station. A distance between the base station and the mobile station is therefore variable. If the base station transmits a radio signal produced by a usual power amplifying circuit to have a fixed or predetermined electric power, the mobile station receives the radio signal with a variable electric power depending on the distance.

In the manner which will later be described a little more in detail, a conventional power amplifying circuit amplifies the input signal having the electric power in response to an amplification control signal to produce an output signal having an amplified electric power. The control signal controls the amplified electric power so as to keep an electric power of the received radio signal fixed. The conventional power amplifying circuit is defective in that it is impossible to produce the output signal having a desired waveform in a wide range.

SUMMARY OF THE INVENTION

It is therefore an object of the present invention to provide a power amplifying circuit capable of producing an output signal having a desired waveform in a wide range.

Other objects of this invention will become clear as the description proceeds.

On describing the gist of this invention, it is possible to understand that a power amplifying circuit is for amplifying an input signal having an input electric power in response to an amplification control signal to produce an output signal having an amplified electric power and includes (a) a power amplifier for amplifying the input electric power into the amplified electric power, (b) a detector connected to the power amplifier for detecting the amplified electric power to produce a detection signal, (c) power control signal generating means for generating a power control signal based on the amplification control signal, (d) a comparator connected to the detector and the power control signal generating means for comparing the detection signal and the power control signal to produce an error signal, and (e) a driver connected to the comparator and the power amplifier for driving the power amplifier based on the error signal.

According to this invention, the above-understood power amplifying circuit comprises a reference signal generator for generating a reference signal with a predetermined waveform, and a multiplier connected to the power control signal generating means, the reference signal generator, and the comparator for multiplying the power control signal and the reference signal and for producing a level control signal as the power control signal.

DESCRIPTION OF THE PREFERRED EMBODIMENT

Figure 1:
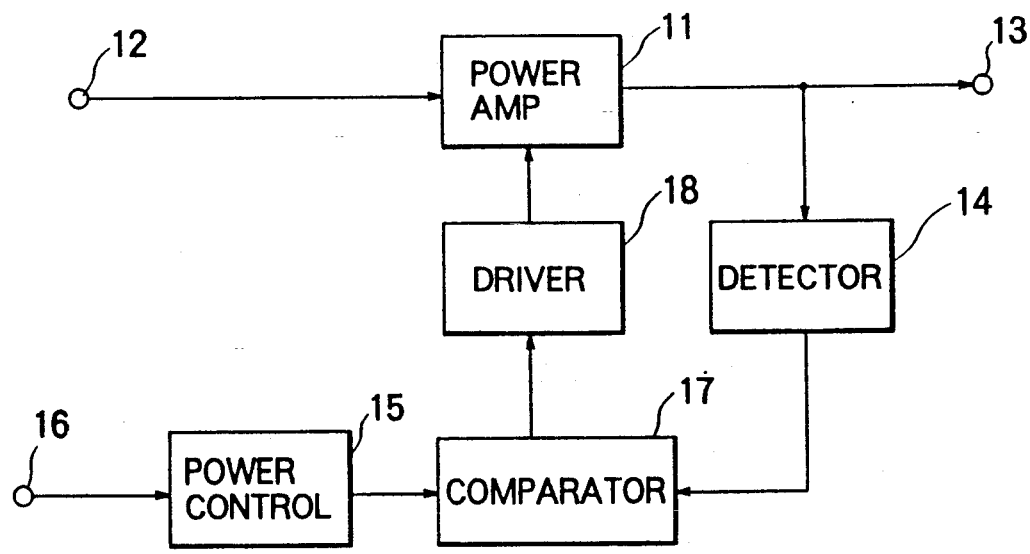
FIG. 1 is a block diagram of a conventional power amplifying circuit.

Referring to FIG. 1, a conventional power amplifying circuit will first be described in order to facilitate an understanding of the present invention. The power amplifying circuit is for amplifying an input signal having an electric power in response to an amplification control signal to produce an output signal having an amplified electric power.

In FIG. 1, the power amplifying circuit comprises a power amplifier 11 having an input terminal 12 and an output terminal 13. The power amplifier 11 is for amplifying the input electric power into the amplified electric power. A detector 14 is connected to the output terminal 13 of the power amplifier 11 for detecting the amplified electric power to produce a detection signal. A power control signal generator 15 has an amplification control signal input terminal 16 and is for generating a power control signal based on the amplification control signal. A comparator 17 is connected to the detector 14 and the power control signal generator 15 for comparing the detection signal and the power control signal to produce an error signal. A driver 18 is connected to the comparator 17 and the power amplifier 11 for driving the power amplifier 11 based on the error signal.

The input signal is supplied to the input terminal 12. The power amplifier 11 amplifies the input electric power into the amplified electric power. The power amplifier 11 supplies the output signal to the output terminal 13. The power amplifier 11 has a gain controlled by a driving signal supplied from the driver 18.

The detector 14 detects the amplified electric power to produce the detection signal. The detector 14 supplies the detection signal to the comparator 17.

The amplification control signal input terminal 16 is connected to a power controller (not shown). The power controller supplies the amplification control signal to the amplification control signal input terminal 16. The power control signal generator 15 produces the power control signal in response to the amplification control signal for supply to the comparator 17.

The comparator 17 compares the detection signal and the power control signal to produce the error signal.

The comparator 17 supplies the error signal to the driver 18.

The driver 18 drives the power amplifier 11 based on the error signal. A gain of the power amplifier 11 depends on the error signal.

Figure 2:
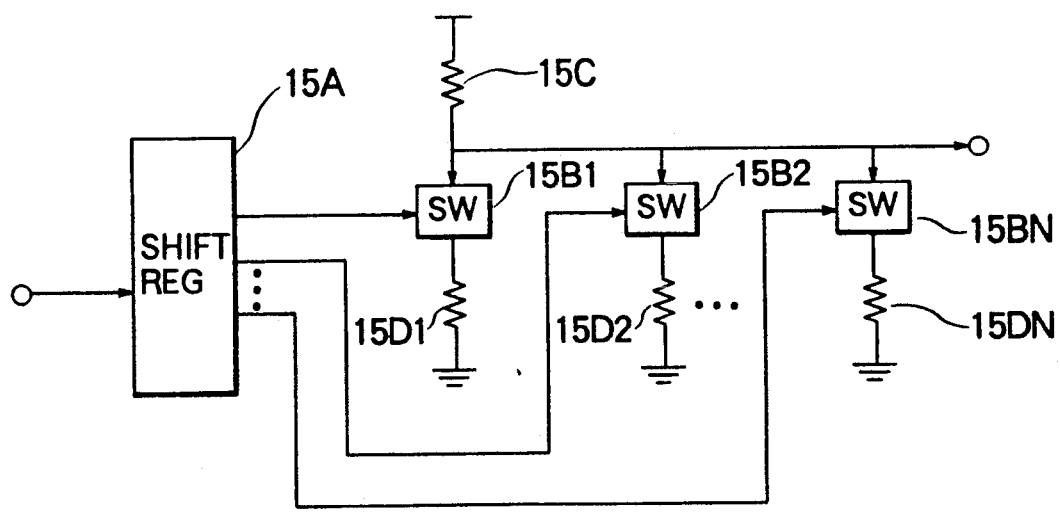
FIG. 2 is a block diagram of a power control signal generator for use in the radio receiver illustrated in FIG. 1.

Referring to FIG. 2, the power control signal generator 15 will be described more in detail. In FIG. 2, the power control signal generator 15 comprises a shift register 15A for converting a serial N-bit data into a parallel N-bit data. The parallel N-bit data are supplied to first through N-th switches 15B1, 15B2, ..., and 15BN, where N represents a predetermined positive integer. An n-th switch 15Bn is supplied with one bit of the parallel N-bit data at a time, where n is variable between 1 and N, both inclusive. The switches 15 (suffix omitted) are supplied in common with electric power through a power supplying resistor 15C from a power source indicated by a horizontal short line and individually grounded by grounding resistors 15D1, 15D2, ..., and 15DN, respectively.

The amplification control signal is the serial N-bit data. Each bit of the N-bit data has a low or a high level. The n-th switch 15Bn is turned on to an on state, if the bit is supplied thereto with the high level. The n-th switch 15Bn is turned off to an off state, if the bit is supplied with the low level. The power control signal generator 15 produces the power control signal which is decided by a resistance of the power supplying resistor 15C, resistance of the grounding resistors 15D1, 15D2, ..., and 15DN, and the on and the off states of the switches 15.

Figure 3:
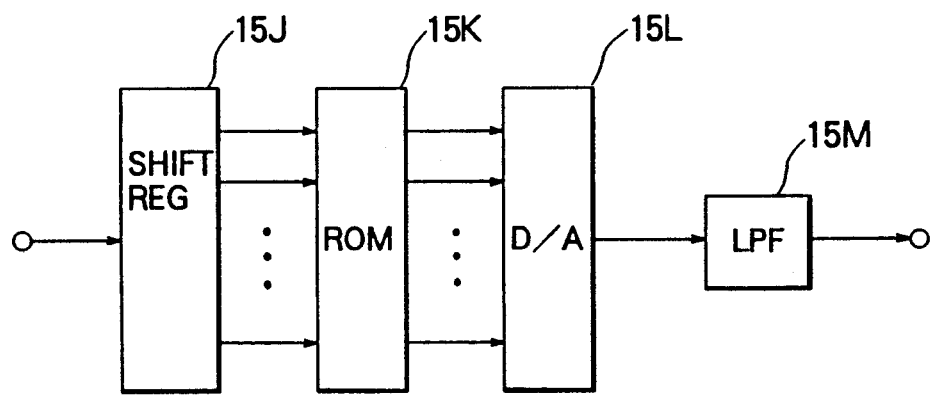
FIG. 3 is a block diagram of another power control signal generator for use in the radio receiver illustrated in FIG. 1.

Referring to FIG. 3, another power control signal generator 15 comprises a shift register 15J for converting a serial N-bit data into a parallel N-bit data for use as an address data. A read only memory 15K is connected to the shift register 15J and memorizes digital power control signals for producing one of the digital power control signals in response to the address data. A digital/analog converter 15L is connected to the read only memory 15K for converting the digital power control signal into an analog power control signal. A low pass filter 15M is connected to the digital/analog converter 15L for filtering the analog power control signal.

Figure 4:
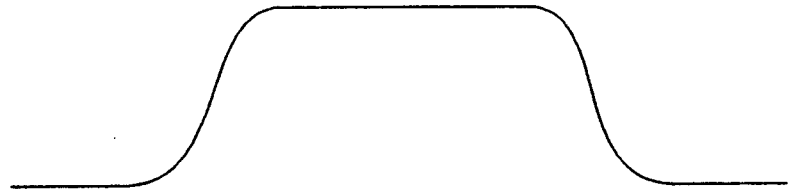
FIG. 4 shows an expected waveform of an output signal of a power amplifying circuit in general.

When used in a time division multiple access transmitter, the power amplifying circuit must produce the power control signal which has in general a waveform having smooth rise and fall exemplified in FIG. 4. This is in order to suppress a broadening of a spectrum of an output signal of the power amplifying circuit when the switches 15 are put into the on and the off states. In Pan-European mobile telephone system (GSM), the power amplifying circuit must control electric power of the output signal in a range between 30 dB and 42 dB.

Figure 5:
FIG. 5 shows a waveform of an output signal of the radio receiver illustrated in FIG. 1.

The conventional power amplifying circuit with the power control signal generator 15 shown in FIG. 2 is difficult to exactly control the electric power in a wide range of 30 dB to 42 dB. The conventional power amplifying circuit with the power control signal generator 15 shown in FIG. 3 does not produce an output signal having an expected waveform when the electric power is 40 dB. This is because the read only memory 15K has a narrow dynamic range. In this case, the waveform of the output signal is depicted in FIG. 5.

Figure 6:
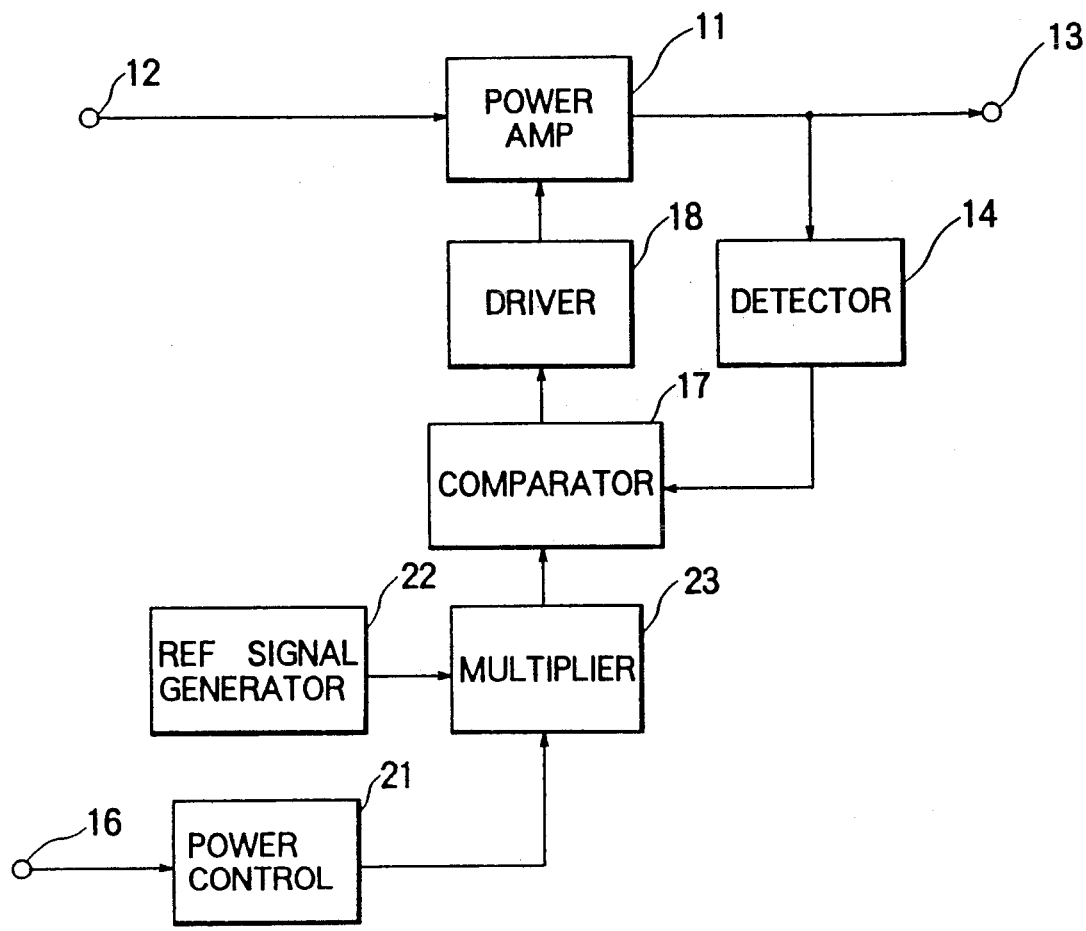
FIG. 6 is a block diagram of a power amplifying circuit according to an embodiment of this invention.

Referring to FIG. 6, the description will proceed to a power amplifying circuit according to a preferred embodiment of this invention. Similar parts are designated by like reference numerals.

The power amplifying circuit is for amplifying an input signal having an input electric power in response to an amplification control signal to produce an output signal having an amplified electric power. The power amplifying circuit includes a power amplifier 11 for amplifying the input electric power into the amplified electric power. A detector 14 is connected to the power amplifier 11 for detecting the amplified electric power to produce a detection signal. A power control signal generator 21 is for generating a power control signal based on the amplification control signal. A comparator 17 is connected to the detector 14 and the power control signal generator 21 for comparing the detection signal and the power control signal to produce an error signal. A driver 18 is connected to the comparator 17 and the power amplifier 11 for driving the power amplifier 11 based on the error signal.

The power amplifying circuit comprises a reference signal generator 22 for generating a reference signal with a predetermined waveform. A reference signal generator 22 is described as an envelope generator in U.S. Pat. No. 4,706,262. A multiplier 23 is connected to the power control signal generator 21, the reference signal generator 22, and the comparator 17 for multiplying the power control signal of the power control signal generator 21 and the reference signal supplied from the reference signal generator to supply a level control signal as the power control signal to the comparator 17. For example, the multiplier 23 is an analog multiplier NJM4200 which is made by New Japan Radio Corporation.

Figure 7:
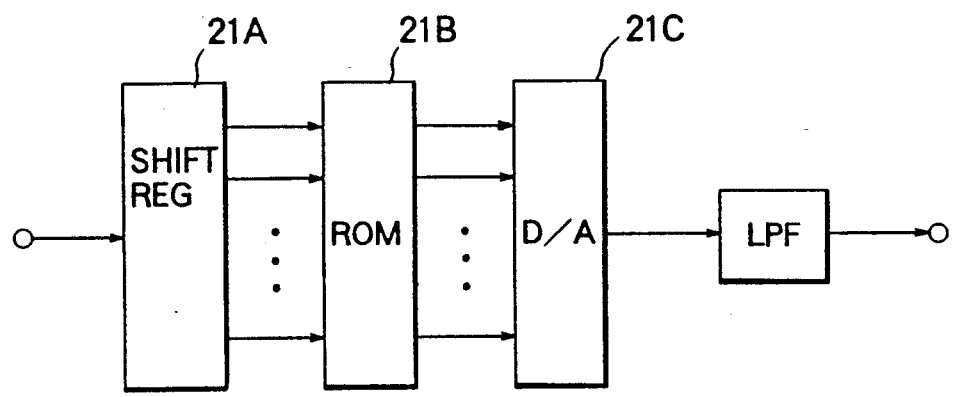
FIG. 7 is a block diagram of a power control signal generator for use in the radio receiver illustrated in FIG. 6.

Turning temporarily to FIG. 7, the power control signal generator 21 comprises a shift register 21A for converting a serial N-bit data into a parallel N-bit data for use as an address data. A read-only memory 21B is connected to the shift register 21A and memorizes digital power control signals for producing one of the digital power control signals in response to the address data. A digital/analog converter 21C is connected to the read-only memory 21B for converting the digital power control signal into an analog power control signal for use as a direct voltage signal.

Turning back to FIG. 6, the reference signal generator 22 produce the reference signal which has a waveform as depicted in FIG. 4. The waveform is always kept at a fixed form.

The multiplier 23 receives the analog power control signal and the reference signal and produce the level control signal. The level control signal has a waveform which is similar to the waveform of the reference signal. The level control signal has an amplitude which corresponds to a voltage of the analog power control signal.

Figure 8:
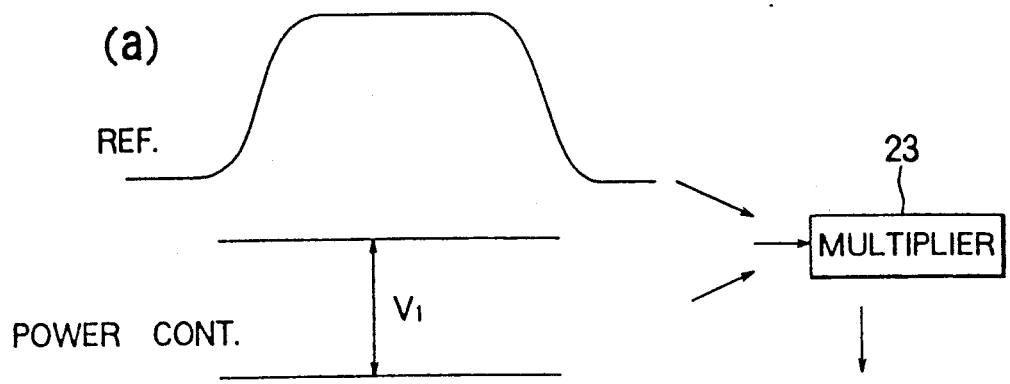
FIGS. 8($a$) and 8($b$) show waveforms of an output signal of the radio receiver illustrated in FIG. 6.
Figure 8:
Figure 8:
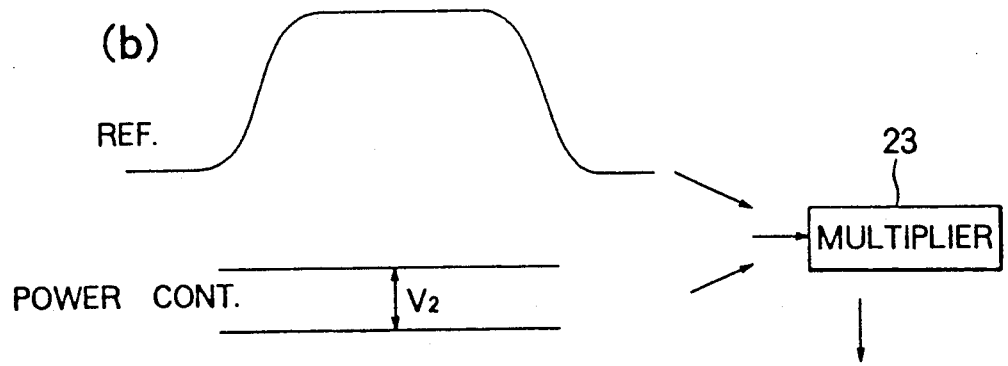
Figure 8:

Turning to FIG. 8(a), it will be assumed that the analog power control signal has a voltage V1. In this event, the level control signal has an amplitude V1 and has a waveform which is similar to the waveform of the reference signal. In FIG. 8(b), it will be assumed that the analog power control signal has a voltage V2. In this event, the level control signal has an amplitude V2 and has a waveform which is similar to the waveform of the reference signal.

Turning back again to FIG. 6, the detector 14 detects the amplified electric power to produce the detection signal. The comparator 17 receives the detection signal and the power control signal and produces the error signal. The comparator 17 supplies the error signal to the driver 18. The driver 18 drives the power amplifier 11 based on the error signal. The power amplifier produces the output signal having the amplified electric power. The power amplifier 11 has a gain depending on the error signal. The power amplifying circuit can produce the output signal having an expected waveform at a wide range of the gain.

What is claimed is:

1. A power amplifying circuit for amplifying an input signal having input electric power in response to an amplification control signal to produce an output signal having amplified electric power, said power amplifying circuit including:

(a) a power amplifier for amplifying said input electric power into said amplified electric power;
   (b) a detector connected to said power amplifier for detecting said amplified electric power to produce a detection signal representative of a level of said amplified electric power;
   (c) power control signal generating means for generating a power control signal which has a d.c. level determined by said amplification control signal;
   (d) a comparator connected to said detector and said power control signal generating means for comparing said detection signal with said power control signal to produce an error signal representative of a difference between said detection signal and said power control signal;
   (e) a driver connected to said comparator and said power amplifier for driving said power amplifier based on said error signal;
   (f) a reference signal generator for generating a reference signal which has a predetermined waveform specified by a smooth rising edge and a smooth falling edge; and
   (g) a multiplier connected to said power control signal generating means, said reference signal generator, and said comparator for multiplying said power control signal and said reference signal to produce, as said power control signal, a level control signal which has similarity to said reference signal and an amplitude determined by said power control signal and to supply said power control signal to said comparator.

2. A power amplifying circuit as claimed in claim 1, wherein:

said power control signal generating means comprises:
   a shift register for producing an address signal based on said amplification control signal;
   a read only memory connected to said shift register for memorizing digital control signals to supply one of said digital control signals based on said address signal; and
   digital/analog converter connected to said read only memory for converting said one of the digital control signals to an analog control signal as said power control signal.

* * * * *